United States Patent
Horiuchi et al.

(10) Patent No.: US 11,374,037 B2
(45) Date of Patent: Jun. 28, 2022

(54) DRIVING CIRCUIT, TFT SUBSTRATE, AND DISPLAY DEVICE

(71) Applicant: Sharp Kabushiki Kaisha, Sakai (JP)

(72) Inventors: Satoshi Horiuchi, Sakai (JP); Yoshihiro Asai, Sakai (JP); Isao Ogasawara, Sakai (JP); Masakatsu Tominaga, Sakai (JP); Yoshihito Hara, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 314 days.

(21) Appl. No.: 16/486,840

(22) PCT Filed: Feb. 14, 2018

(86) PCT No.: PCT/JP2018/005097
§ 371 (c)(1),
(2) Date: Aug. 19, 2019

(87) PCT Pub. No.: WO2018/155284
PCT Pub. Date: Aug. 30, 2018

(65) Prior Publication Data
US 2020/0043958 A1 Feb. 6, 2020

(30) Foreign Application Priority Data
Feb. 21, 2017 (JP) .............................. JP2017-030233

(51) Int. Cl.
*H01L 27/12* (2006.01)
*G09G 3/36* (2006.01)
(Continued)

(52) U.S. Cl.
CPC ....... *H01L 27/1255* (2013.01); *G09G 3/3648* (2013.01); *H01L 27/124* (2013.01);
(Continued)

(58) Field of Classification Search
CPC ............. H01L 27/1255; H01L 27/1225; H01L 27/124; H01L 27/3262; H01L 27/3265;
(Continued)

(56) References Cited

U.S. PATENT DOCUMENTS

2005/0110932 A1 5/2005 Chang et al.
2006/0145160 A1* 7/2006 Park ...................... G02F 1/1345
257/72
(Continued)

FOREIGN PATENT DOCUMENTS

CN 100529926 C 8/2009
CN 102394247 A 3/2012
(Continued)

OTHER PUBLICATIONS

Official Communication issued in International Patent Application No. PCT/JP2018/005097, dated May 1, 2018.

*Primary Examiner* — Shahed Ahmed
*Assistant Examiner* — Sun Mi Kim King
(74) *Attorney, Agent, or Firm* — Keating & Bennett, LLP

(57) ABSTRACT

The present invention reduces a circuit scale of a driving circuit while maintaining a characteristic of the driving circuit. In a driving circuit of the present invention, a transistor (TRc) including a gate electrode, a semiconductor film (HF), and first and second conductive electrodes (S, D) is provided on an upper side of the substrate. The driving circuit further includes a first conductive film (21) provided in a layer lower than the gate electrode, a second conductive film (22) that serves as the gate electrode, and a first capacitor (C1) defined between the first conductive film (21) and the second conductive film (22).

15 Claims, 10 Drawing Sheets

(51) Int. Cl.
*G02F 1/1368* (2006.01)
*H01L 27/32* (2006.01)

(52) U.S. Cl.
CPC ........ *H01L 27/1225* (2013.01); *G02F 1/1368* (2013.01); *G09G 2300/0408* (2013.01); *G09G 2300/08* (2013.01); *H01L 27/3262* (2013.01); *H01L 27/3265* (2013.01)

(58) Field of Classification Search
CPC ... H01L 21/822; H01L 21/8234; H01L 27/04; H01L 27/06; H01L 29/41733; H01L 29/7869; G09G 3/3648; G09G 2300/0408; G09G 2300/08; G09G 2230/00; G09G 2310/0286; G09G 3/3677; G02F 1/1368; G02F 1/13454; G09F 9/30
See application file for complete search history.

(56) References Cited

U.S. PATENT DOCUMENTS

| | | | |
|---|---|---|---|
| 2011/0007049 | A1* | 1/2011 | Kikuchi ................ H01L 27/124 345/208 |
| 2011/0012105 | A1 | 1/2011 | Yamazaki et al. |
| 2011/0012880 | A1* | 1/2011 | Tanaka ................ H01L 27/1214 345/211 |
| 2013/0039455 | A1 | 2/2013 | Horiuchi et al. |
| 2013/0075766 | A1 | 3/2013 | Chang et al. |
| 2014/0218654 | A1 | 8/2014 | Ochiai et al. |

FOREIGN PATENT DOCUMENTS

| | | |
|---|---|---|
| JP | 2005-244132 A | 9/2005 |
| JP | 2011-040726 A | 2/2011 |
| JP | 2014-149429 A | 8/2014 |
| WO | 2011/135873 A1 | 11/2011 |

* cited by examiner

DRIVING CIRCUIT, TFT SUBSTRATE, AND DISPLAY DEVICE

TECHNICAL FIELD

The present invention relates to a driving circuit (driver) provided in a display device.

BACKGROUND ART

Patent Literature 1 discloses a driving circuit that includes (i) a thin film transistor (TFT) provided on a substrate and (ii) a capacitor connected to the TFT. The capacitor is defined between a metal of a source layer that serves as a source of the TFT and a metal of a layer that is located in a layer upper than the source layer.

CITATION LIST

Patent Literature

[Patent Literature 1]
Domestic re-publication of PCT International Publication No. 2011/135873 (Publication Date: Nov. 3, 2011)

SUMMARY OF INVENTION

Technical Problem

The above configuration has a problem that a circuit scale is increased depending on areas occupied by electrodes that form a capacitor.

Solution to Problem

A driving circuit in accordance with an aspect of the present invention includes: a substrate; a transistor which is provided on an upper side of the substrate, the transistor including a gate electrode, a semiconductor film, a first conductive electrode, and a second conductive electrode; a first conductive film provided in a layer lower than the gate electrode; a second conductive film that serves as the gate electrode; and a first capacitor defined between the first conductive film and the second conductive film.

Advantageous Effects of Invention

An aspect of the present invention makes it possible to reduce a circuit scale while maintaining a characteristic of a driving circuit.

DESCRIPTION OF EMBODIMENTS

The following description will discuss embodiments of the present invention with reference to FIGS. 1 through 10. Note, however, that those embodiments are only illustrative.

Figure 1:
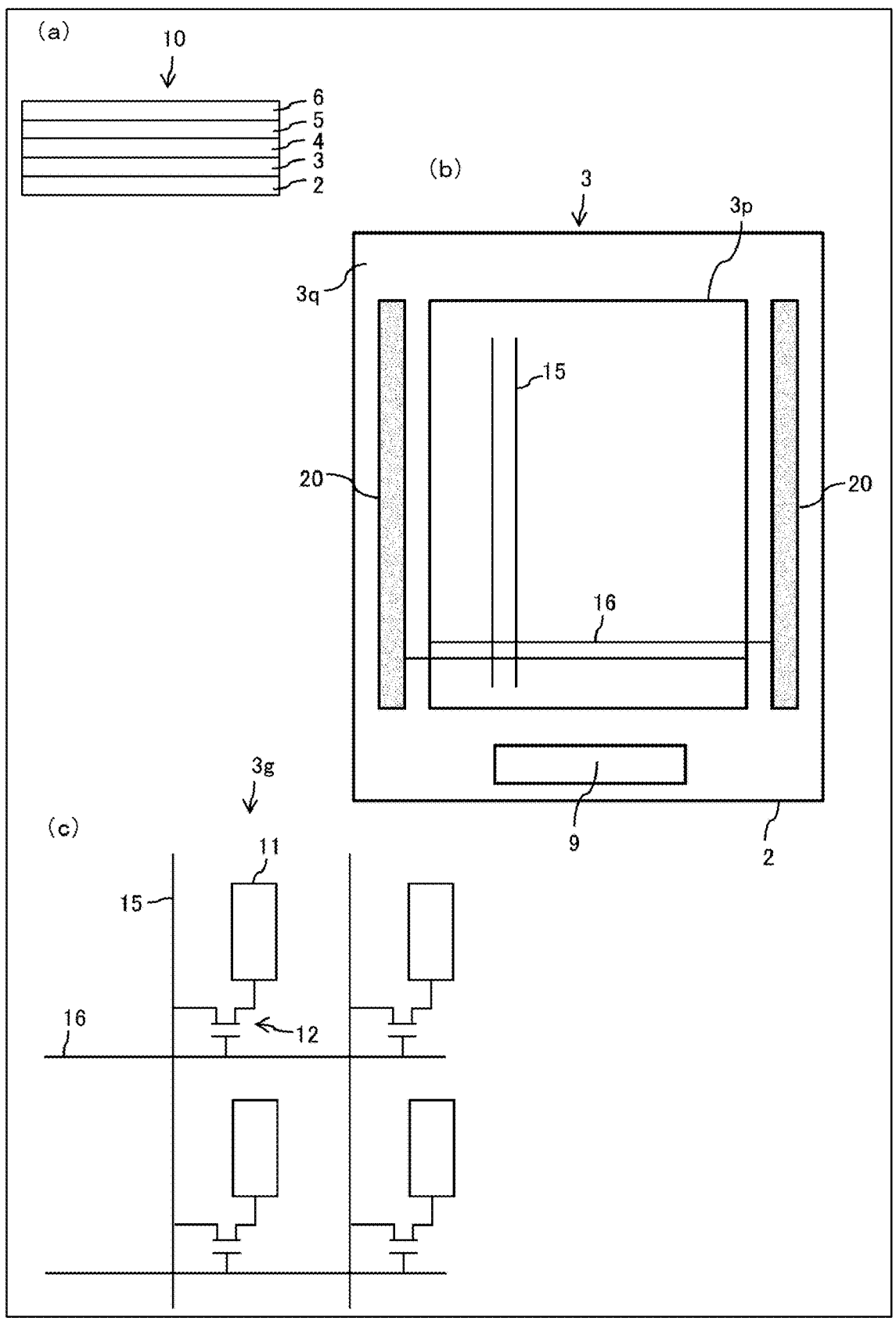
FIG. 1 is a view illustrating a configuration of a display device in accordance with some embodiments of the present invention. (a) of FIG. 1 is a schematic cross-sectional view illustrating an overall configuration of the display device. (b) of FIG. 1 is a schematic plan view illustrating the overall configuration of the display device. (c) of FIG. 1 is a circuit diagram illustrating a pixel circuit of a display section.

FIG. 1 is a view illustrating a configuration of a display device in accordance with some embodiments of the present invention. (a) of FIG. 1 is a schematic cross-sectional view illustrating an overall configuration of the display device. (b) of FIG. 1 is a schematic plan view illustrating the overall configuration of the display device. (c) of FIG. 1 is a circuit diagram illustrating a pixel circuit of a display section.

As illustrated in FIG. 1, a display device 10 in accordance with some embodiments of the present invention includes a backlight (not illustrated), a TFT substrate 3 including a substrate 2, a liquid crystal layer 4, a color filter substrate 5, and an optical film 6.

The TFT substrate 3 has a display section 3p which includes (i) a pixel electrode 11, (ii) a transistor 12, (iii) a data signal line 15, and (iv) a scanning signal line 16. In a pixel circuit 3g, the pixel electrode 11 is connected via the transistor 12 to the data signal line 15 and the scanning signal line 16. Note that a fringe-field switching (FFS) mode can be employed as well by providing a common electrode (not illustrated) on the TFT substrate 3. Further, an in-cell touch sensor can be also provided by use of the common electrode.

The TFT substrate 3 has a non-display section (non-active part) 3q in which (i) a gate driver (driving circuit) 20 for driving the scanning signal line 16 is provided and (ii) an IC chip 9 including a source driver for driving the data signal line 15 is provided. The gate driver 20 and the pixel circuit 3g are provided in a monolithic form on the same substrate 2.

Figure 2:
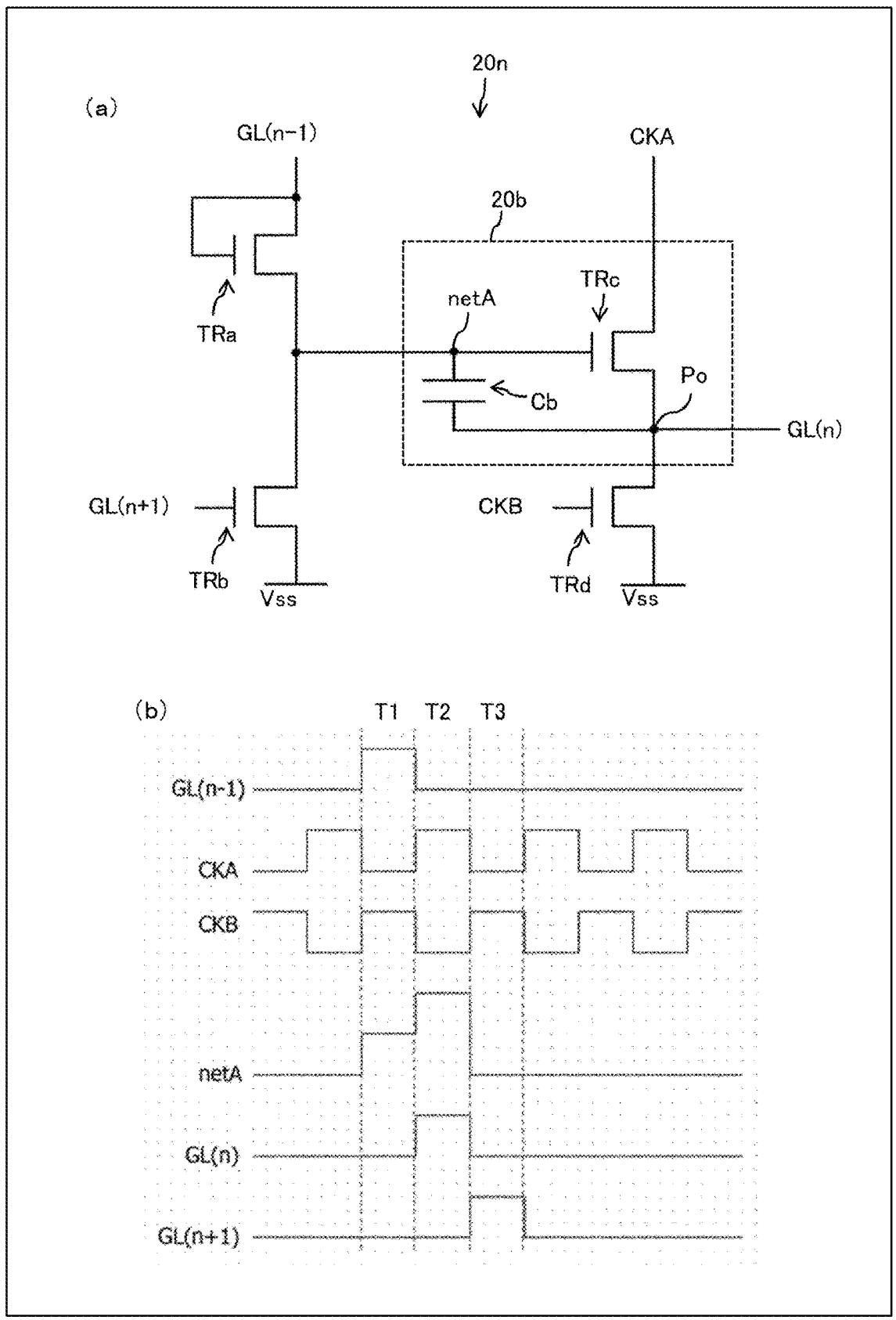
FIG. 2 is a view for explaining a gate driver in accordance with some embodiments of the present invention. (a) of FIG. 2 is a circuit diagram of a circuit configuration of a unit circuit in the gate driver. (b) of FIG. 2 is a signal timing chart in relation to the circuit configuration of the unit circuit in the gate driver.

FIG. 2 is a view for explaining the gate driver 20. (a) of FIG. 2 is a circuit diagram of circuit configuration of a unit circuit in the gate driver. (b) of FIG. 2 is a signal timing chart in relation to the circuit configuration of the unit circuit in the gate driver.

As illustrated in (a) of FIG. 2, an n-th unit circuit 20n in the gate driver 20 includes transistors TRa through TRd. In the n-th unit circuit 20n, a bootstrap circuit 20b is constituted which includes the transistor TRc and a bootstrap capacitor Cb. In the bootstrap circuit 20b, a gate electrode and a drain electrode of the transistor TRc are connected to each other via the bootstrap capacitor Cb, and an output pad Po of the n-th unit circuit 20n is connected to the drain electrode of the transistor TRc.

The n-th unit circuit 20n operates as follows. That is, during a period T1, a signal of an (n−1)th gate line GL(n−1) is inputted to the transistor TRa, so that an internal node (netA) is precharged. In this period, the transistor TRc and transistor TRd are in an ON state, and a gate line GL(n) is charged at a low potential (VSS) because a clock signal CKA is at a low potential (VSS). During a subsequent period T2, the clock signal CKA is switched to a high potential (VDD), and a clock signal CKB is switched to a low potential (VSS). In this period, the transistor TRc is in an ON state and the transistor TRd is in an OFF state, and therefore the gate line GL(n) is charged at the high potential (VDD) of the clock signal CKA. From this, the gate line GL(n) is charged and the internal node (netA) is boosted up to a higher potential via the capacitor Cb, and this makes it possible to apply a sufficiently high voltage to the gate electrode of the transistor TRc for charging the gate line GL(n) up to the high potential (VDD). Moreover, during this period, a signal of the gate line GL(n) is supplied to an (n+1)th unit circuit 20(n+1) and consequently an internal node of the gate driver for the (n+1)th unit circuit 20(n+1) is precharged. During a subsequent period T3, the clock signal CKA is switched to a low potential (VSS) and the clock signal CKB is switched to a high potential (VDD). This causes the gate line GL(n) to discharge to have a low potential (VSS) via the transistor TRd. At this time, a (n+1)th gate line GL(n+1) is charged to have a high potential (VDD), so that the transistor TRb enters an ON state. From this, the internal node (netA) is discharged to the low potential (VSS), and thus the operation of the n-th gate line GL(n) ends. After that, the low potential (VSS) is supplied to the gate line GL(n) via the transistor TRd in accordance with points in time which are specified by the clock signal CKB, so that the gate line GL(n) is kept in a low potential state until an operation is carried out in a next frame.

Embodiment 1

Figure 3:
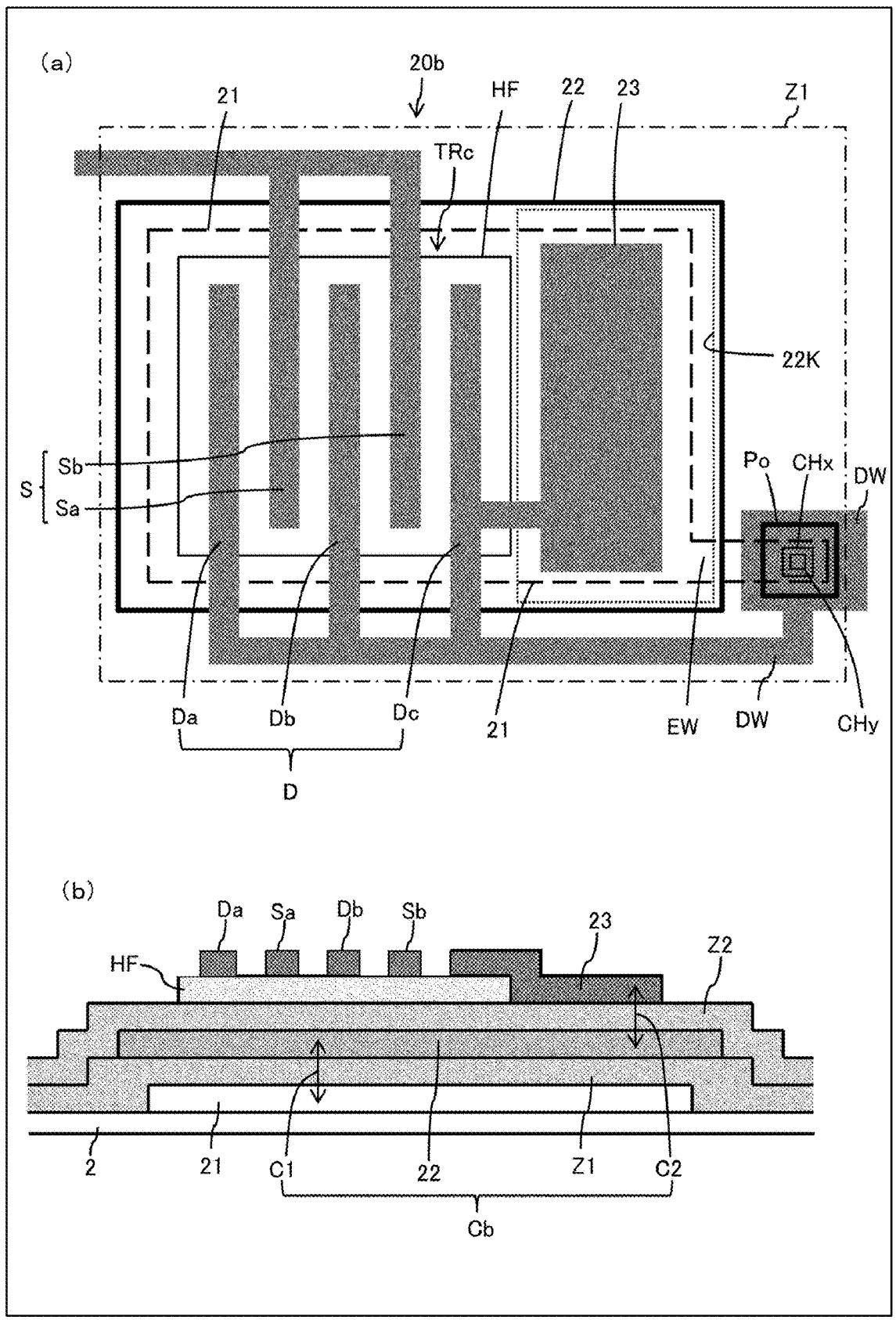
FIG. 3 is a view illustrating a part which is of the gate driver and constitutes a bootstrap circuit in accordance with Embodiment 1. (a) of FIG. 3 is a plan view illustrating the bootstrap circuit. (b) of FIG. 3 is a cross-sectional view illustrating a channel of a transistor in the bootstrap circuit.
Figure 4:
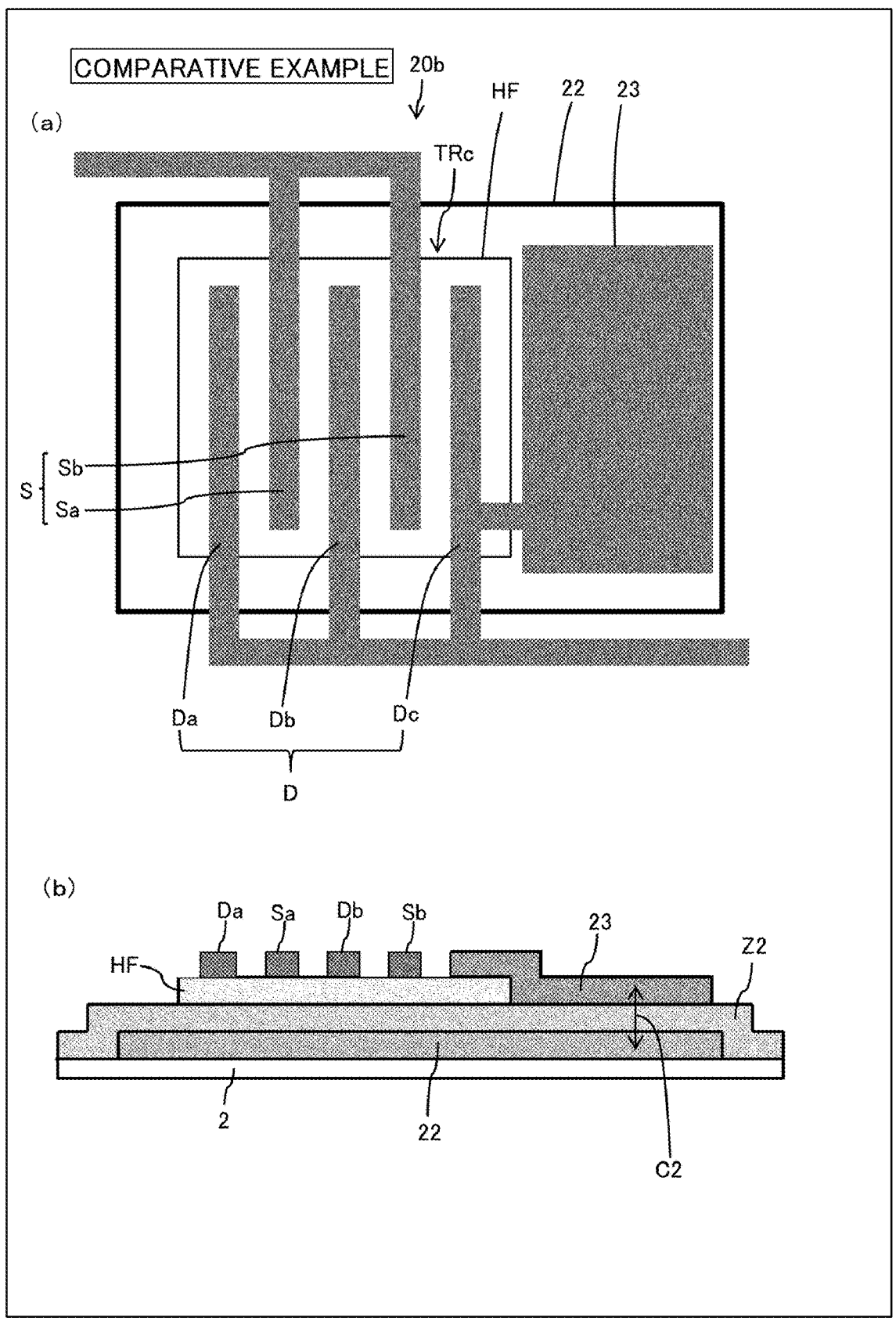
FIG. 4 is a view illustrating a part which is of a gate driver and constitutes a bootstrap circuit in accordance with Comparative Example. (a) of FIG. 4 is a plan view illustrating the bootstrap circuit. (b) of FIG. 4 is a cross-sectional view illustrating a channel of the transistor in the bootstrap circuit.
Figure 5:
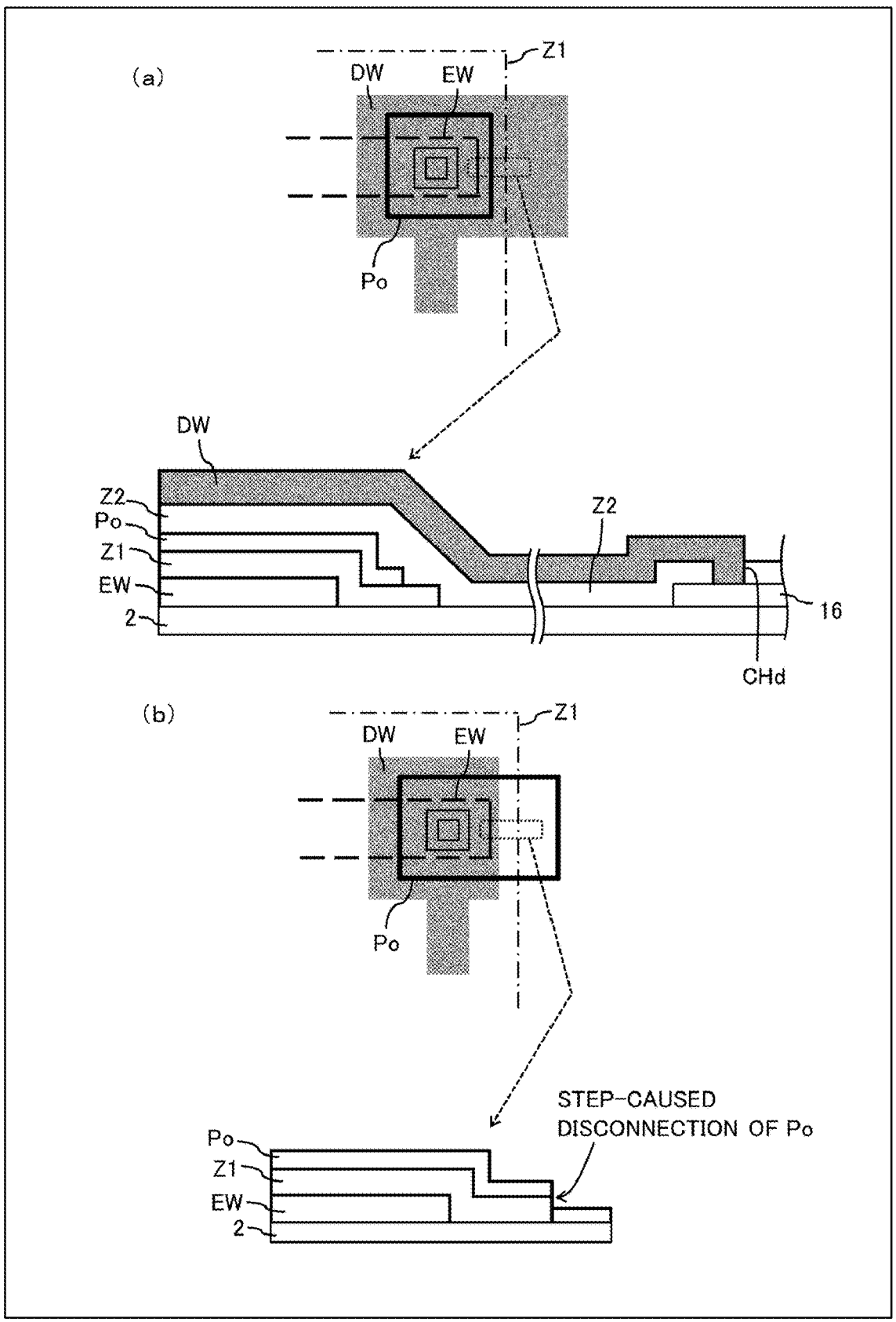
FIG. 5 is a schematic view for explaining one of advantageous effects brought about by Embodiment 1.

FIG. 3 is a view illustrating a part which is of a gate driver and constitutes a bootstrap circuit in accordance with Embodiment 1 of the present invention. (a) of FIG. 3 is a plan view illustrating the bootstrap circuit. (b) of FIG. 3 is a cross-sectional view illustrating a channel of the transistor in the bootstrap circuit.

As illustrated in FIG. 3, a bootstrap circuit 20b of the gate driver is configured by providing, on a substrate 2, (i) a first conductive film 21, (ii) an extending wire EW that extends from the first conductive film 21, (iii) an insulating film Z1 (e.g., an inorganic insulating film such as a silicon nitride film or a silicon oxide film) which is provided in a layer upper than the first conductive film 21, (iv) a second conductive film 22 provided in a layer upper than the insulating film Z1, (v) an insulating film Z2 (gate insulating film, e.g., an inorganic insulating film such as a silicon nitride film or a silicon oxide film) which is provided in a layer upper than the second conductive film 22, (vi) a semiconductor film HF provided in a layer upper than the insulating film Z2, and, (vii) in a layer upper than the semiconductor film HF, sub-source electrodes Sa and Sb, sub-drain electrodes Da through Dc, a third conductive film 23 connected to the sub-drain electrode Dc, and a drawing wire DW connected to the sub-drain electrodes Da through Dc.

The semiconductor film HF is, for example, an oxide semiconductor film. The semiconductor film HF may contain at least one metallic element among In, Ga, and Zn. In Embodiment 1, the semiconductor film HF contains, for example, an In—Ga—Zn—O-based semiconductor. The In—Ga—Zn—O-based semiconductor specified herein is a ternary oxide of indium (In), gallium (Ga), and zinc (Zn). A ratio (composition ratio) of In, Ga, and Zn is not limited to any particular one, and may be, for example, In:Ga:Zn=2:2:1, In:Ga:Zn=1:1:1, or In:Ga:Zn=1:1:2.

In Embodiment 1, a bottom-gate transistor TRc (see FIG. 2) is configured by (i) the second conductive film 22 serving as a gate electrode, (ii) the semiconductor film HF, (iii) a source electrode S including the sub-source electrodes Sa and Sb, and (iv) a drain electrode D including the sub-drain electrodes Da through Dc.

The sub-source electrodes Sa and Sb and the sub-drain electrodes Da through Dc extend in a column direction (in which the data signal line extends). A first channel (in a row direction) is provided below a gap between the sub-source electrode Sa and the sub-drain electrode Da. A second channel (in the row direction) is provided below a gap between the sub-source electrode Sa and the sub-drain electrode Db. A third channel (in the row direction) is provided below a gap between the sub-source electrode Sb and the sub-drain electrode Db. A fourth channel (in the row direction) is provided below a gap between the sub-source electrode Sb and the sub-drain electrode Dc. The drawing wire DW and the extending wire EW extend in the row direction (in which the scanning signal line extends).

In Embodiment 1, the first conductive film 21 and the second conductive film 22 overlap each other via the insulating film Z1, so that a first capacitor C1 is defined between the first conductive film 21 and the second conductive film 22. The second conductive film 22 and the third conductive film 23 overlap each other via the insulating film Z2, so that a second capacitor C2 is defined between the second conductive film 22 and the third conductive film 23.

The first conductive film 21 entirely overlaps the second conductive film 22. The semiconductor film HF entirely overlaps the first conductive film 21. A whole area of the first conductive film 21 is larger than an area by which the first conductive film 21 overlaps the semiconductor film HF. The semiconductor film HF entirely overlaps the second conductive film 22. The second conductive film 22 includes an extended region 22K that overlaps the first conductive film 21 and the third conductive film 23 but does not overlap the semiconductor film HF.

The bootstrap circuit 20b further includes an output pad Po that is provided in the layer (gate layer) in which the second conductive film 22 is provided. The output pad Po and the drawing wire DW which is connected to the sub-drain electrodes Da through Dc are connected to each other via a first contact hole CHx. The output pad Po and the extending wire EW which extends from the first conductive film 21 are connected to each other via a second contact hole CHy. This establishes electrical connection between the first conductive film 21 and the third conductive film 23. In other words, the first conductive film 21 and the drain electrode D are electrically connected to each other.

According to Embodiment 1, the first conductive film 21 is electrically connected to the third conductive film 23

(connected to the drain electrode D), so that the capacitor C1 (defined between the first conductive film 21 and the second conductive film 22) and the capacitor C2 (defined between the second conductive film 22 and the third conductive film 23) are connected in parallel with each other. As described above, since the second conductive film 22 serves as the gate electrode of the transistor TRc illustrated in FIG. 2, the bootstrap capacitor Cb illustrated in FIG. 2 can be constituted by the capacitors C1 and C2 which are connected in parallel with each other in the configuration of Embodiment 1 (i.e., it is possible to obtain the following: capacitance of the bootstrap capacitor Cb=capacitance of capacitor C1+capacitance of capacitor C2). This configuration allows reduction in areas of the second conductive film 22 and the third conductive film 23 and consequently reduction in circuit scale of the gate driver 20, while maintaining the capacitance of the bootstrap capacitor Cb, as compared with Comparative Example illustrated in FIG. 4 (in which the first conductive film 21 is not provided).

In Embodiment 1, the capacitance of the bootstrap capacitor Cb is enhanced by (i) a capacitor defined between the first conductive film 21 and the extended region 22K (which does not overlap the semiconductor film HF) of the second conductive film 22 and (ii) a capacitor defined between the third conductive film 23 and the extended region 22K.

Further, the first conductive film 21 entirely overlaps the second conductive film 22, and therefore an electric field generated by the first conductive film 21 can be shielded. This makes it possible to prevent the channels from receiving an adverse effect.

Moreover, the semiconductor film HF entirely overlaps the first conductive film 21, and this allows the first through fourth channels to have uniform characteristics.

Further, the second contact hole CHy opens within the first contact hole CHx in the plan view, and this allows reduction in circuit area, as compared with a case in which contact holes are provided at locations away from each other.

Note that the insulating film Z1, which covers the first conductive film 21 (lower conductive member), is configured such that an edge of the insulating film Z1 does not overlap an intermediate conductive member that is provided in the gate layer. Specifically, as illustrated in FIG. 3 and (a) of FIG. 5, the output pad Po (intermediate conductive member) does not overlap the edge of the insulating film Z1 and the drawing wire DW (upper conductive member) extending from the drain electrode D is provided over the edge of the insulating film Z1. In a region where the insulating film Z1 is not provided, the drawing wire DW (upper conductive member) which is led out to this region is connected (switched), via the contact hole CHd, to the scanning signal line 16 (corresponding to the gate line GL(n) of FIG. 2) which is provided in the layer (gate layer) in which the second conductive film 22 is provided (see (a) of FIG. 5). This configuration ensures electrical connection between the output pad Po and the scanning signal line 16 of the display section. Note that, in a case where the output pad Po (intermediate conductive member) is provided over the edge of the insulating film Z1 (e.g., the output pad Po (intermediate conductive member) is extended and connected to the scanning signal line), a step-caused disconnection may occur in the output pad Po at and around the edge of the insulating film Z1 (see (b) of FIG. 5), and such a disconnection may further impair electrical connection with the scanning signal line.

Figure 6:
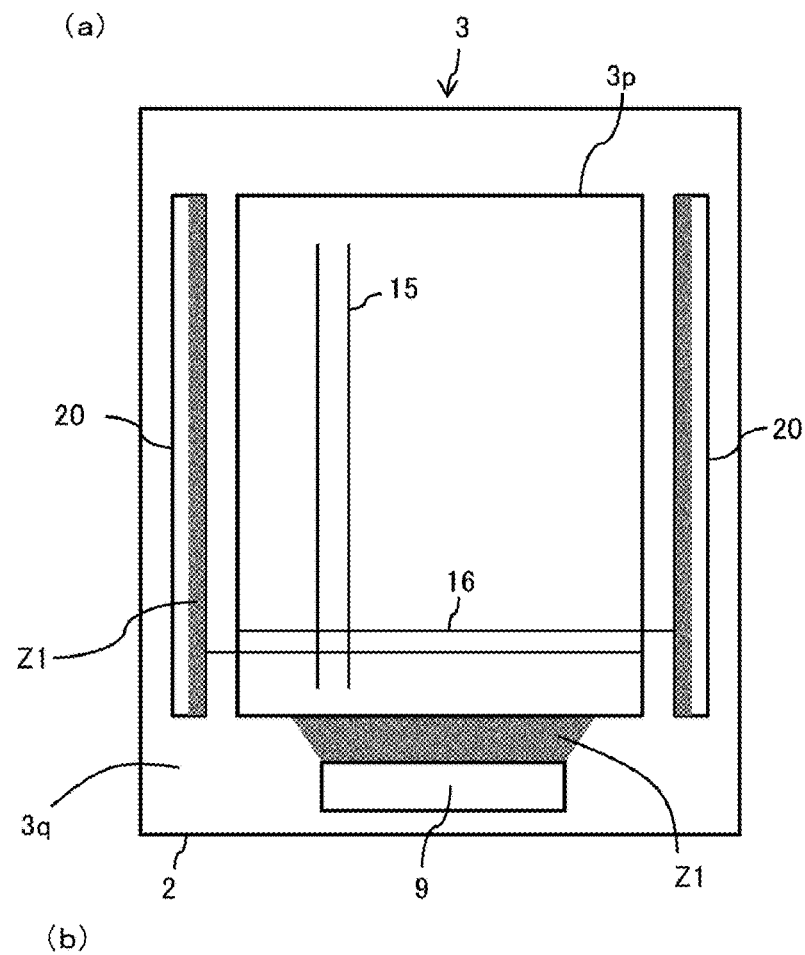
FIG. 6 is a view illustrating a configuration of a display device in accordance with Embodiment 1 of the present invention. (a) of FIG. 6 is a schematic plan view illustrating an overall configuration of the display device. (b) of FIG. 6 is a schematic plan view illustrating a configuration example of a non-display section.
Figure 6:
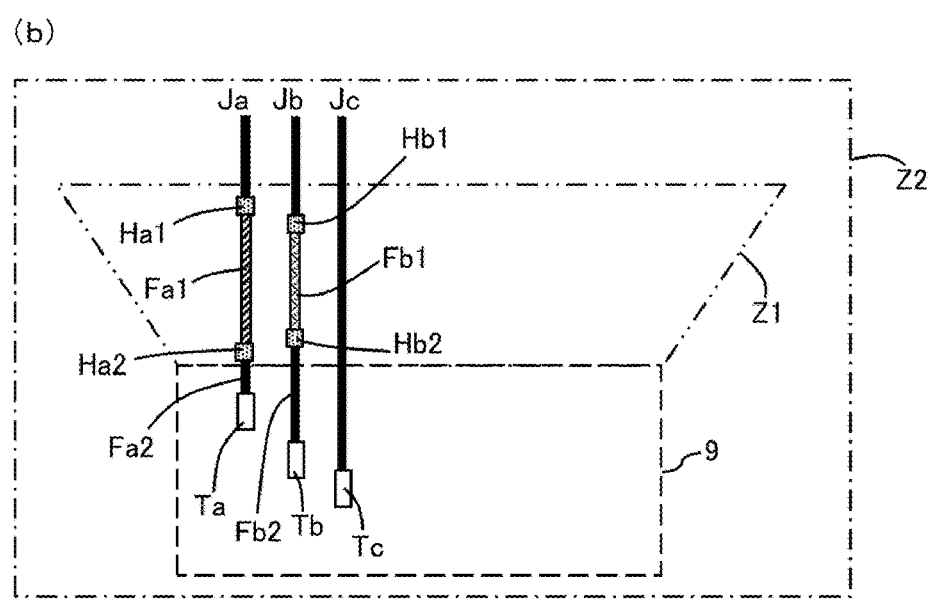

Note that the insulating film Z1 provided between the first conductive film 21 and the second conductive film 22 is locally present only in a non-display region (see (a) of FIG. 6). Specifically, the insulating film Z1 occupies less than 20% of an area of the TFT substrate 3, and therefore the TFT substrate 3 will not warp.

The TFT substrate 3 is configured as follows (see (b) of FIG. 6). That is, a lower conductive member Fa1 is provided in a layer lower than a gate electrode of a transistor in the display section. An intermediate conductive member Fb1 is provided in the layer in which the gate electrode of the transistor is provided. Upper conductive members Ja, Jb, Jc, Fa2, and Fb2 and terminals Ta through Tc are provided in a layer upper than the gate electrode. The insulating film Z1 is provided so as to cover the lower conductive member Fa1, and the insulating film Z2 is provided so as to cover the intermediate conductive member Fb1. The terminals Ta through Tc are connected to the IC chip 9 including a source driver.

Specifically, the upper conductive member Ja (e.g., an end of the data signal line) is connected to the lower conductive member Fa1 (relay wire) via a contact hole Ha1, the lower conductive member Fa1 is connected to the upper conductive member Fa2 (terminal wire) via the contact hole Ha2, and the upper conductive member Fa2 is connected to the terminal Ta.

Further, the upper conductive member Jb (e.g., an end of the data signal line) is connected to the intermediate conductive member Fb1 (relay wire) via a contact hole Hb1, the intermediate conductive member Fb1 is connected to the upper conductive member Fb2 (terminal wire) via a contact hole Hb2, and the upper conductive member Fb2 is connected to the terminal Tb.

Further, the upper conductive member Jc (e.g., an end of the data signal line) is connected to the terminal Tc.

In the configuration illustrated in FIG. 6, the lower conductive member Fa1 and the intermediate conductive member Fb1 do not overlap the edge of the insulating film Z1, and the upper conductive members Ja, Jb, Jc, Fa2, and Fb2 are provided over the edge of the insulating film Z1. This configuration improves reliability of connection between the data signal line 15 and the IC chip 9. In contrast, in a case where the intermediate conductive member is provided over the edge of the insulating film Z1, a step-caused disconnection may occur in the intermediate conductive member at and around the edge.

Embodiment 2

Figure 7:
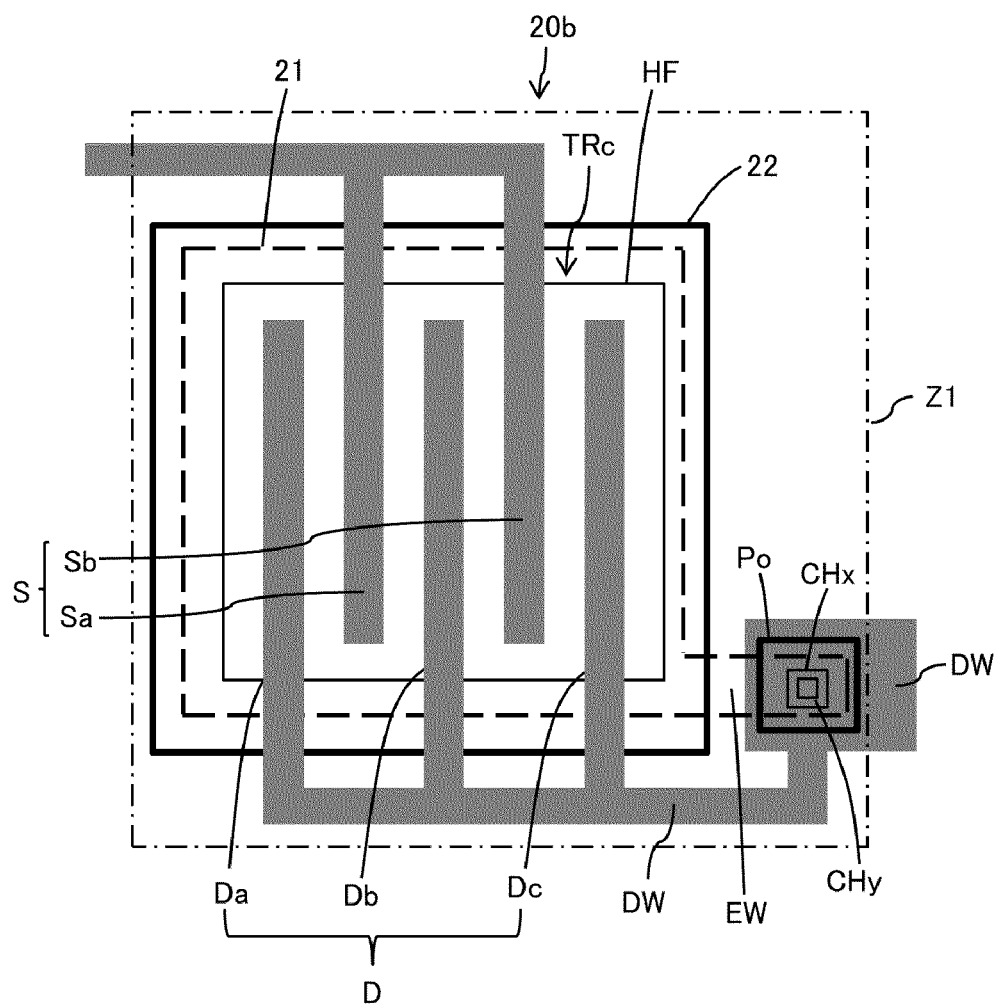
FIG. 7 is a plan view illustrating a part which is of a gate driver and constitutes a bootstrap circuit in accordance with Embodiment 2 of the present invention.

FIG. 7 is a plan view illustrating a part which is of a gate driver and constitutes a bootstrap circuit in accordance with Embodiment 2 of the present invention.

As illustrated in FIG. 7, a bootstrap circuit 20b of the gate driver is configured by providing, on an upper side of a substrate 2, (i) a first conductive film 21, (ii) an extending wire EW that extends from the first conductive film 21, (iii) an insulating film Z1 (e.g., an inorganic insulating film such as a silicon nitride film or a silicon oxide film) which is provided in a layer upper than the first conductive film 21, (iv) a second conductive film 22 provided in a layer upper than the insulating film Z1, (v) an insulating film Z2 (gate insulating film, e.g., an inorganic insulating film such as a silicon nitride film or a silicon oxide film) which is provided in a layer upper than the second conductive film 22, (vi) a semiconductor film HF provided in a layer upper than the insulating film Z2 and, (vii) in a layer upper than the semiconductor film HF, sub-source electrodes Sa and Sb, sub-drain electrodes Da through Dc, and a drawing wire DW connected to the sub-drain electrodes Da through Dc.

In Embodiment 2, a bottom-gate transistor TRc (see FIG. 2) is configured by (i) the second conductive film 22 serving as a gate electrode, (ii) the semiconductor film HF, (iii) a source electrode S including the sub-source electrodes Sa and Sb, and (iv) a drain electrode D including the sub-drain electrodes Da through Dc.

In Embodiment 2, the first conductive film 21 and the second conductive film 22 overlap each other via the insulating film Z1, so that a first capacitor C1 is defined between the first conductive film 21 and the second conductive film 22.

The first conductive film 21 entirely overlaps the second conductive film 22. The semiconductor film HF entirely overlaps the first conductive film 21. A whole area of the first conductive film 21 is larger than an area by which the first conductive film 21 overlaps the semiconductor film HF. The semiconductor film HF entirely overlaps the second conductive film 22.

The bootstrap circuit 20b further includes an output pad Po that is provided in the layer (gate layer) in which the second conductive film 22 is provided. The output pad Po and the drawing wire DW which is connected to the sub-drain electrodes Da through Dc are connected to each other via a first contact hole CHx. The output pad Po and the extending wire EW that extends from the first conductive film 21 are connected to each other via a second contact hole CHy. Thus, the first conductive film 21 and the drain electrode D are electrically connected to each other.

In Embodiment 2, the capacitor C1 is defined between the first conductive film 21 and the second conductive film 22. As described above, since the second conductive film 22 serves as the gate electrode of the transistor TRc illustrated in FIG. 2, the bootstrap capacitor Cb illustrated in FIG. 2 can be configured by the capacitor C1 provided on a rear side of the semiconductor film HF in Embodiment 2 (i.e., it is possible to obtain the following: capacitance of bootstrap capacitor Cb=capacitance of capacitor C1). This configuration allows reduction in area of the second conductive film 22 and consequently reduction in circuit scale of a gate driver 20, while maintaining the capacitance of the bootstrap capacitor Cb, as compared with Comparative Example illustrated in FIG. 4 (in which the first conductive film 21 is not provided).

Further, the second contact hole CHy opens within the first contact hole CHx in the plan view, and this allows reduction in circuit area, as compared with a case in which contact holes are provided at locations away from each other.

Further, the first conductive film 21 entirely overlaps the second conductive film 22, and therefore an electric field generated by the first conductive film 21 can be shielded. This makes it possible to prevent the channels from receiving an adverse effect.

Moreover, the semiconductor film HF entirely overlaps the first conductive film 21, and this allows the first through fourth channels to have uniform characteristics.

Note that the insulating film Z1, which covers the first conductive film 21 (lower conductive member), is configured such that an edge of the insulating film Z1 does not to overlap an intermediate conductive member that is provided in the gate layer. Specifically, as illustrated in FIG. 7 and (a) of FIG. 5, the output pad Po (intermediate conductive member) does not overlap the edge of the insulating film Z1, and the drawing wire DW (upper conductive member) of the drain electrode D is provided over the edge of the insulating film Z1. This configuration ensures electrical connection between the output pad Po and the scanning signal line of the display section.

Figure 8:
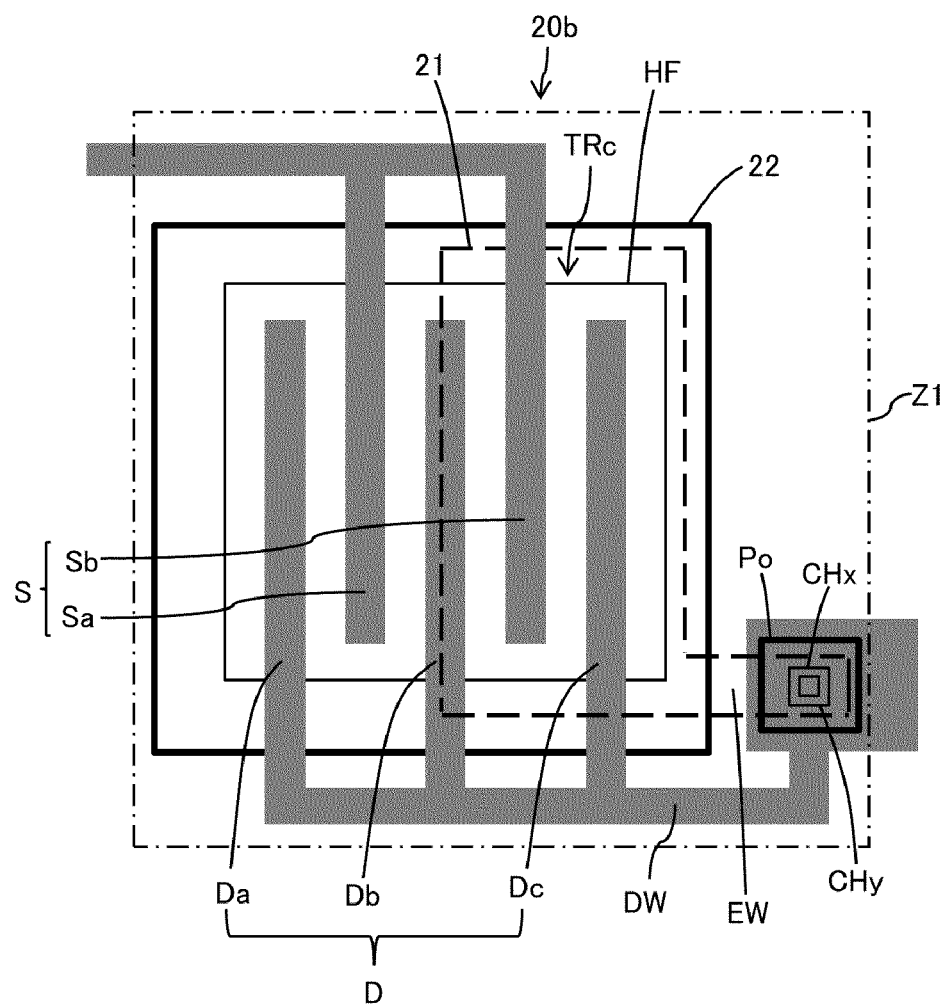
FIG. 8 is a plan view illustrating a modification example of Embodiment 2.
Figure 9:
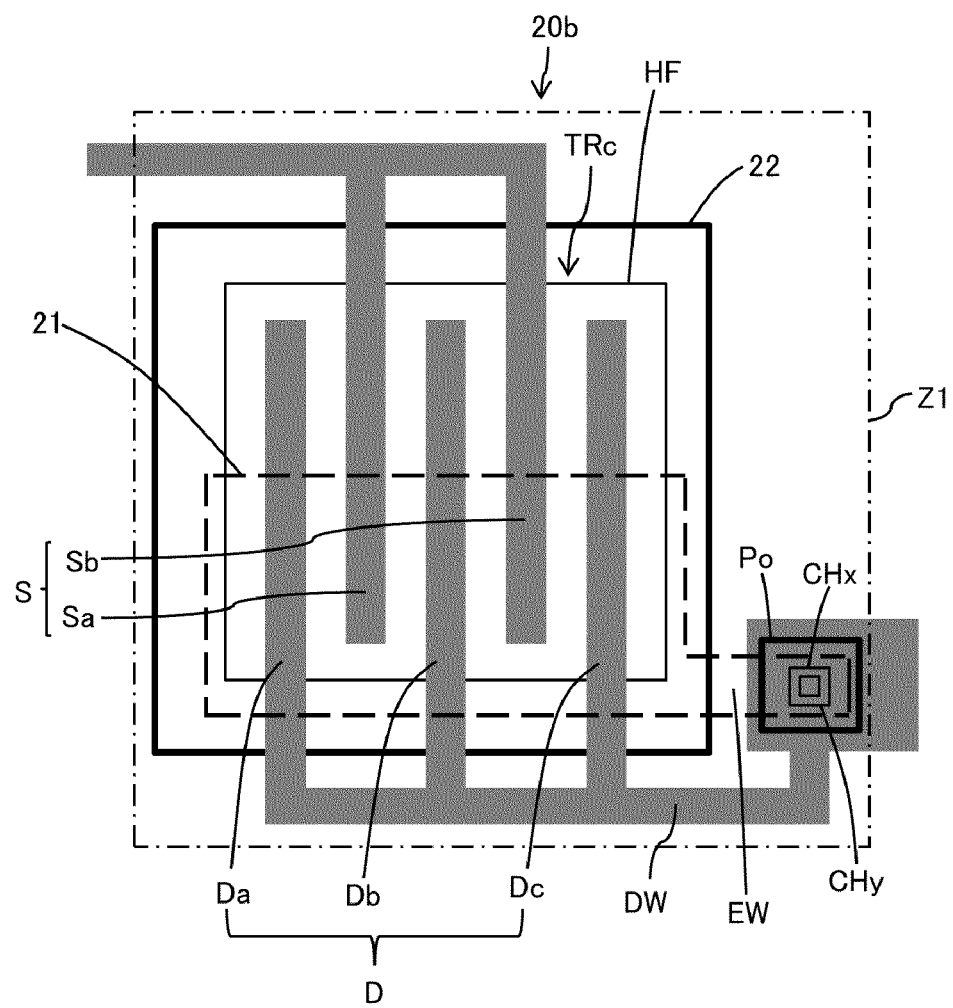
FIG. 9 is a plan view illustrating another modification example of Embodiment 2.

Alternatively, according to Embodiment 2, the first conductive film 21 can be provided as follows (see FIG. 8). That is, the first conductive film 21 can have, at its edge, a part that extends orthogonally to a direction (row direction) in which each channel of the transistor TRc is formed and that overlaps the sub-drain electrode Db. In a case where a size of the first conductive film 21 is reduced so that the edge of the first conductive film 21 overlaps the semiconductor film HF, it is possible to prevent, by the configuration illustrated in FIG. 8, the edge of the first conductive film 21 from crossing the channels. Note that the edge of the first conductive film 21 can overlap four channels as illustrated in FIG. 9.

Embodiment 3

Figure 10:
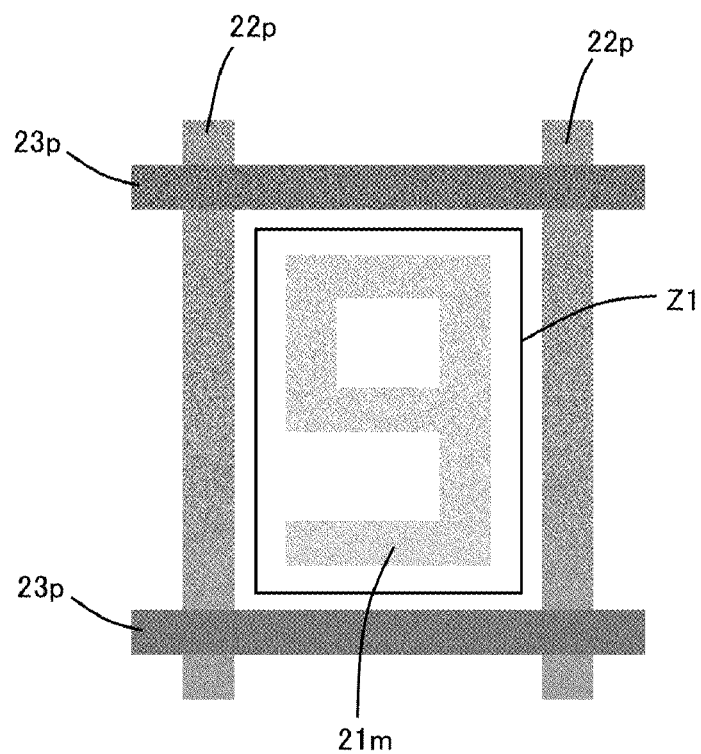
FIG. 10 is a plan view illustrating a configuration in accordance with Embodiment 3 of the present invention.

A mark may be provided in a non-display section of a TFT substrate with use of any of wires in layers. In such a case, as illustrated in FIG. 10, a mark is provided (e.g., a numerical number 9 is drawn) with use of a wire 21m that is provided in a layer in which a first conductive film 21 is provided. Note that this layer is different from (i) a layer in which a second conductive film 22 and a wire 22p are provided and (ii) a layer in which a third conductive film 23 and a wire 23p are provided. The wire 21m is covered with an insulating film Z1, and this allows the mark to be provided even in a small area, while preventing a short-circuit from occurring between the wire 21m and the wire 22p (provided in the layer in which the second conductive film 22 is provided) and between the wire 21m and the wire 23p (provided in the layer in which the third conductive film 23 is provided).

Regarding Embodiments 1 Through 3

In Embodiments 1 through 3, examples in which the driving circuit is used in the liquid crystal display device have been described. Note, however, that the driving circuit in accordance with an aspect of the present invention is suitably applicable also to a driving circuit of a self-emitting panel such as an organic light emitting diode (OLED) panel.

[Recap]

A driving circuit in accordance with a first aspect of the present invention, includes: a substrate; a transistor which is provided on an upper side of the substrate, the transistor including a gate electrode, a semiconductor film, a first conductive electrode, and a second conductive electrode; a first conductive film provided in a layer lower than the gate electrode; a second conductive film that serves as the gate electrode; and a first capacitor defined between the first conductive film and the second conductive film.

In a second aspect of the present invention, the driving circuit is configured such that the first conductive film is electrically connected to the second conductive electrode.

In a third aspect of the present invention, the driving circuit is configured such that the semiconductor film is provided in a layer that is upper than the second conductive film and is lower than the first conductive electrode and the second conductive electrode.

In a fourth aspect of the present invention, the driving circuit is configured to further include a third conductive film that is provided in a layer in which the first conductive electrode and the second conductive electrode are provided, the third conductive film being connected to the second conductive electrode.

In a fifth aspect of the present invention, the driving circuit is configured to further include a second capacitor defined between the second conductive film and the third conductive film.

In a sixth aspect of the present invention, the driving circuit is configured such that the first conductive film entirely overlaps the second conductive film.

In a seventh aspect of the present invention, the driving circuit is configured such that the semiconductor film entirely overlaps the first conductive film.

In an eighth aspect of the present invention, the driving circuit is configured such that the semiconductor film entirely overlaps the second conductive film.

In a ninth aspect of the present invention, the driving circuit is configured such that an area of the first conductive film is larger than an area by which the first conductive film overlaps the semiconductor film.

In a tenth aspect of the present invention, the driving circuit is configured such that the second conductive film includes an extended region that overlaps the first conductive film and the third conductive film and does not overlap the semiconductor film.

In an eleventh aspect of the present invention, the driving circuit is configured such that an edge of the first conductive film has a part that (i) extends orthogonally to a direction in which a channel of the transistor is formed and (ii) overlaps the second conductive electrode.

In a twelfth aspect of the present invention, the driving circuit is configured to further include: an output pad which is provided in a layer in which the gate electrode is provided, the output pad being electrically connected to the second conductive electrode.

In a thirteenth aspect of the present invention, the driving circuit is configured such that the output pad is connected to a drawing wire via a first contact hole, the drawing wire being led out from the second conductive electrode.

In a fourteenth aspect of the present invention, the driving circuit is configured such that the output pad is connected to an extending wire via a second contact hole, the extending wire extending from the first conductive film.

In a fifteenth aspect of the present invention, the driving circuit is configured such that, in a plan view, the second contact hole opens within the first contact hole.

In a sixteenth aspect of the present invention, the driving circuit is configured such that the drawing wire is provided over an edge of an insulating film which is provided between the first conducive film and the second conductive film.

In a seventeenth aspect of the present invention, the driving circuit is configured such that a clock signal is supplied to the first conductive electrode.

In an eighteenth aspect of the present invention, the driving circuit is configured such that the first capacitor serves as a bootstrap capacitor.

In a nineteenth aspect of the present invention, the driving circuit is configured such that the semiconductor film is made of oxide semiconductor.

In a twentieth aspect of the present invention, the driving circuit is configured such that one of the first conductive electrode and the second conductive electrode is configured by a plurality of parallel sub-source electrodes, and the other of the first conductive electrode and the second conductive electrode is configured by a plurality of parallel sub-drain electrodes.

A TFT substrate in accordance with a twenty-first aspect of the present invention includes: the aforementioned driving circuit; and a pixel circuit, the driving circuit and the pixel circuit being provided in a monolithic form on a substrate.

In a twenty-second aspect of the present invention, the TFT substrate is configured to further include a scanning signal line which is driven by the driving circuit.

In a twenty-third aspect of the present invention, the TFT substrate is configured to further include a marking wire which is provided in a layer in which the first conductive film is provided.

In a twenty-fourth aspect of the present invention, the TFT substrate is configured such that an insulating film provided between the first conductive film and the second conductive film is locally present only in a non-display region.

A TFT substrate in accordance with an a twenty-fifth aspect of the present invention includes a transistor including a gate electrode; a lower conductive member that is provided in a layer lower than the gate electrode; an intermediate conductive member provided in a layer in which the gate electrode is provided; an upper conductive member provided in a layer upper than the gate electrode; and an insulating film provided so as to cover the lower conductive member, the lower conductive member, the intermediate conductive member, the upper conductive member, and the insulating film being provided in a non-active part, the intermediate conductive member being provided so as not to overlap an edge of the insulating film, and the upper conductive member being provided over the edge of the insulating film.

A display device in accordance with a twenty-sixth aspect of the present invention includes the aforementioned TFT substrate.

The present invention is not limited to the foregoing embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

REFERENCE SIGNS LIST

2 Substrate
3 TFT substrate
10 Display device
16 Scanning signal line
21 First conductive film (lower conductive member)
22 Second conductive film
23 Third conductive film
Z1, Z2 Insulating film
DW Drawing wire (upper conductive member)
EW Extending wire
Cb Bootstrap capacitor
C1 First capacitor
C2 Second capacitor
TRc Transistor
Po Output Pad (intermediate conductive member)

The invention claimed is:
1. A driving circuit comprising:
a substrate;
a transistor which is provided on an upper side of the substrate, the transistor including a gate electrode, a semiconductor film, a first conductive electrode, and a second conductive electrode, a first conductive film provided in a layer lower than the gate electrode;

a second conductive film that serves as the gate electrode; and a first capacitor defined between the first conductive film and the second conductive film; wherein the first conductive film is electrically connected to the second conductive electrode, further comprising:

an output pad which is provided in a layer in which the gate electrode is provided, the output pad being electrically connected to the second conductive electrode.

2. The driving circuit as set forth in claim 1, wherein the output pad is connected to a drawing wire via a first contact hole, the drawing wire being led out from the second conductive electrode.

3. The driving circuit as set forth in claim 2, wherein the output pad is connected to an extending wire via a second contact hole, the extending wire extending from the first conductive film.

4. The driving circuit as set forth in claim 3, wherein:
in a plan view, the second contact hole opens within the first contact hole.

5. The driving circuit as set forth in claim 2, wherein the drawing wire is provided over an edge of an insulating film which is provided between the first conducive film and the second conductive film.

6. The driving circuit as set forth in claim 1, wherein a clock signal is supplied to the first conductive electrode, wherein the first capacitor serves as a bootstrap capacitor.

7. The driving circuit as set forth in claim 1, wherein the semiconductor film is made of an oxide semiconductor.

8. The driving circuit as set forth in claim 1, wherein one of the first conductive electrode and the second conductive electrode is configured by a plurality of parallel sub-source electrodes, and the other of the first conductive electrode and the second conductive electrode is configured by a plurality of parallel sub-drain electrodes.

9. A TFT substrate comprising:
the driving circuit recited in claim 1; and
a pixel circuit,
the driving circuit and the pixel circuit being provided in a monolithic form on the substrate,
and further comprising a scanning signal line which is driven by the driving circuit.

10. The TFT substrate as set forth in claim 9, further comprising a marking wire which is provided in a layer in which the first conductive film is provided.

11. A TFT substrate, comprising:
a driving circuit;
a pixel circuit; and
a scanning signal line which is driven by the driving circuit; wherein
the driving circuit and the pixel circuit are provided in a monolithic form on a substrate;
the driving circuit includes:
a substrate;
a transistor which is provided on an upper side of the substrate, the transistor including a gate electrode, a semiconductor film, a first conductive electrode, and a second conductive electrode,
a first conductive film provided in a layer lower than the gate electrode;
a second conductive film that serves as the gate electrode; and
a first capacitor defined between the first conductive film and the second conductive film; and
an insulating film provided between the first conductive film and the second conductive film is locally present only in a non-display region.

12. A TFT substrate comprising:
a transistor including a gate electrode;
a lower conductive member that is provided in a layer lower than the gate electrode;
an intermediate conductive member provided in a layer in which the gate electrode is provided;
an upper conductive member provided in a layer upper than the gate electrode; and
an insulating film provided so as to cover the lower conductive member,
the lower conductive member, the intermediate conductive member, the upper conductive member, and the insulating film being provided in a non-active part,
the intermediate conductive member being provided so as not to overlap an edge of the insulating film, and
the upper conductive member being provided over the edge of the insulating film.

13. A display device comprising a TFT substrate recited in claim 9.

14. A display device comprising a TFT substrate recited in claim 11.

15. A display device comprising a TFT substrate recited in claim 12.

* * * * *